United States Patent
Schricker et al.

(10) Patent No.: US 9,666,771 B2
(45) Date of Patent: May 30, 2017

(54) METHOD OF FORMING A WAVELENGTH CONVERTED LIGHT EMITTING DEVICE

(71) Applicant: KONINKLIJKE PHILIPS N.V., Eindhoven (NL)

(72) Inventors: April Dawn Schricker, Palo Alto, CA (US); Oleg Borisovich Shchekin, San Francisco, CA (US); Kenneth Vampola, Los Altos, CA (US); Hans-Helmut Bechtel, Roetgen (DE); Guido Salmaso, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 15/113,738

(22) PCT Filed: Jan. 20, 2015

(86) PCT No.: PCT/IB2015/050423
§ 371 (c)(1),
(2) Date: Jul. 22, 2016

(87) PCT Pub. No.: WO2015/128750
PCT Pub. Date: Sep. 3, 2015

(65) Prior Publication Data
US 2017/0012183 A1 Jan. 12, 2017

Related U.S. Application Data

(60) Provisional application No. 61/945,170, filed on Feb. 27, 2014.

(51) Int. Cl.
*H01L 21/78* (2006.01)
*H01L 33/50* (2010.01)
(Continued)

(52) U.S. Cl.
CPC ............ *H01L 33/505* (2013.01); *H01L 33/60* (2013.01); *H01L 21/304* (2013.01); *H01L 21/78* (2013.01);
(Continued)

(58) Field of Classification Search
CPC ................... H01L 21/78; H01L 21/304; H01L 2221/69327; H01L 27/02365;
(Continued)

(56) References Cited

U.S. PATENT DOCUMENTS

2007/0221867 A1* 9/2007 Beeson .................. H05B 33/10
250/487.1
2007/0259508 A1 11/2007 Chiu
(Continued)

FOREIGN PATENT DOCUMENTS

EP 2610058 A1 7/2013
WO 2007063460 A1 6/2007

OTHER PUBLICATIONS

EPO as ISA, "International Search Report and Written Opinion" dated May 28, 2015 from International Application No. PCT/IB2015/050423, filed Jan. 20, 2014, 13 pages.

*Primary Examiner* — Thanh T Nguyen
(74) *Attorney, Agent, or Firm* — Volpe and Koenig, P.C.

(57) ABSTRACT

A method according to embodiments of the invention includes disposing a support layer (32) on a surface of a wavelength converting ceramic wafer (30). The wavelength converting ceramic wafer and the support layer are diced (42) to form wavelength converting members. A wavelength converting member is attached to a light emitting device. After attaching the wavelength converting member to the light emitting device, the support layer is removed.

10 Claims, 3 Drawing Sheets

(51) Int. Cl.
*H01L 33/60* (2010.01)
*H01L 31/18* (2006.01)
*H01L 21/304* (2006.01)

(52) U.S. Cl.
CPC ...... *H01L 31/18* (2013.01); *H01L 2933/0041* (2013.01); *H01L 2933/0058* (2013.01)

(58) Field of Classification Search
CPC ..... H01L 33/005; H01L 31/18; H01L 33/505; H01L 33/60; H01L 2933/0058
See application file for complete search history.

(56) References Cited

U.S. PATENT DOCUMENTS

| | | |
|---|---|---|
| 2010/0140648 A1 | 6/2010 | Harada et al. |
| 2011/0284822 A1* | 11/2011 | Jung ................... H01L 33/505 257/13 |
| 2011/0297986 A1* | 12/2011 | Nishiuchi ........... H01L 33/0079 257/98 |
| 2012/0086028 A1 | 4/2012 | Beeson et al. |
| 2012/0178193 A1 | 7/2012 | Lei et al. |
| 2012/1780193 | 7/2012 | Lei et al. |
| 2016/0071767 A1* | 3/2016 | Hashimoto ............. H01L 21/78 257/620 |
| 2016/0372893 A1* | 12/2016 | McLaurin ............. H01S 5/4093 |

* cited by examiner

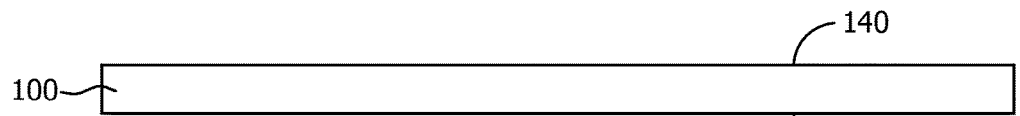
(PRIOR ART) FIG. 1A
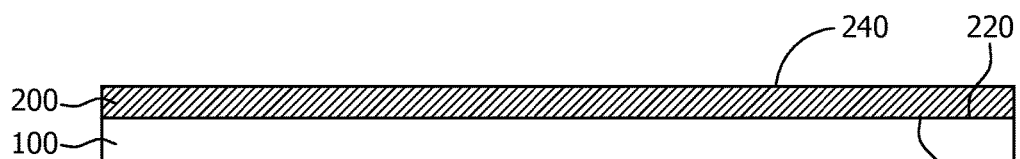
(PRIOR ART) FIG. 1B
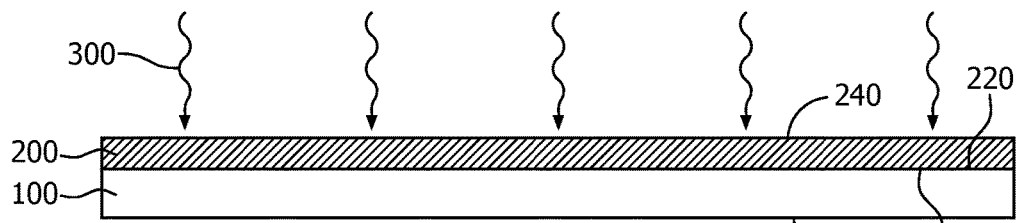
(PRIOR ART) FIG. 1C
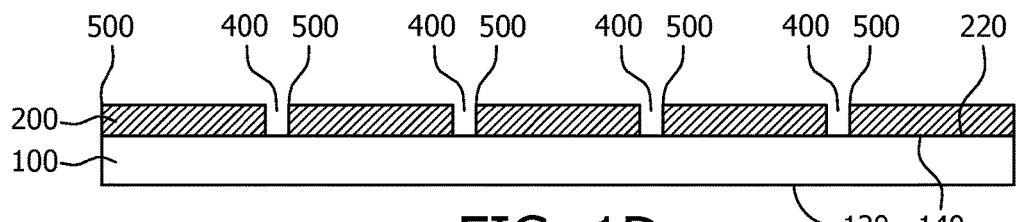
(PRIOR ART) FIG. 1D
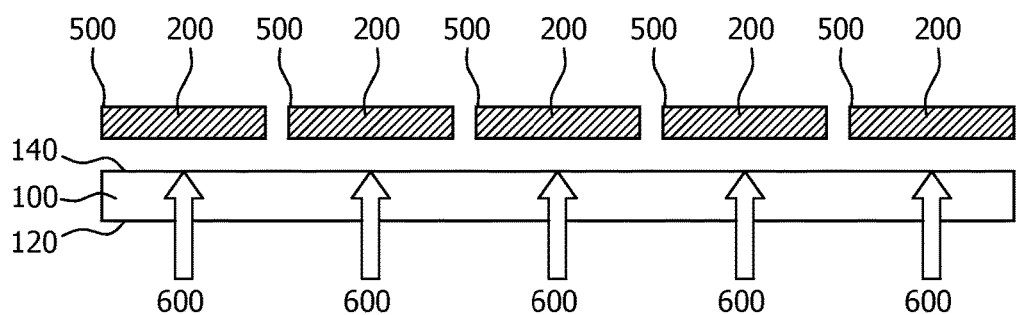
(PRIOR ART) FIG. 1E

METHOD OF FORMING A WAVELENGTH CONVERTED LIGHT EMITTING DEVICE

CROSS-REFERENCE TO RELATED APPLICATIONS

The present application is a §371 application of International Application No. PCT/IB2015/050423 filed on Jan. 20, 2015 and entitled "METHOD OF FORMING A WAVELENGTH CONVERTED LIGHT EMITTING DEVICE," which claims the benefit of U.S. Provisional Application No. 61/945,170, filed Feb. 27, 2014. International Application No. PCT/IB2015/050423 and U.S. Provisional Application No. 61/945,170 are incorporated herein.

FIELD OF THE INVENTION

The present invention relates to a method of forming a wavelength converted light emitting device with a thin wavelength converting element.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. FIGS. 1A-1E are side cross-sectional views illustrating process steps needed to fabricate a wavelength conversion chip, described in more detail in US 2012/0086028. The process is described as follows in US 2012/0086028: The first step in the process for forming wavelength conversion chips is to select a substrate 100, which is shown in a side cross-sectional view in FIG. 1A. The substrate provides a physical support for the subsequent deposition of the wavelength conversion layer. Substrate 100 has a bottom surface 120 and a top surface 140 opposite bottom surface 120. Substrate 100 can be a polymeric material or an inorganic material. See, for example, paragraph 77.

The next process step is to deposit a wavelength conversion layer 200 on the top surface 140 of substrate 100 as illustrated in a side cross-sectional view in FIG. 1B. The wavelength conversion layer 200 has a bottom surface 220 in direct contact with the top surface 140 of substrate 100 and a top surface 240. The wavelength conversion layer 200 is formed from wavelength conversion materials. The wavelength conversion materials absorb light in a first wavelength range and emit light in a second wavelength range, where the light of a second wavelength range has longer wavelengths than the light of a first wavelength range. The wavelength conversion materials may be, for example, phosphor materials or quantum dot materials. The phosphor materials may be in the form of powders, ceramics, thin film solids or bulk solids. See, for example, paragraphs 78 and 79.

The next process step is an optional annealing step, as illustrated in FIG. 1C, to thermally anneal or radiation anneal 300 the wavelength conversion layer 200 in order to increase the wavelength conversion efficiency of the layer or, in the case of a phosphor powder, to sinter the powder to form a ceramic layer. See, for example, paragraph 85.

The next process step is to segment the wavelength conversion layer 200 into a plurality of wavelength conversion chips 500. Grooves or streets 400 are formed through the wavelength conversion layer 200 as shown in a side cross-sectional view in FIG. 1D. The streets 400 are fabricated in two directions (only one direction is shown) to form a plurality of wavelength conversion chips 500 that can be square, rectangular or any other planar geometric shape. See, for example, paragraph 88.

The final step is to remove the plurality of wavelength conversion chips 500 from substrate 100. For example, the plurality of wavelength conversion chips 500 can be removed by directing a pulsed laser beam 600 though substrate 100 to destroy the adhesion of the bottom surface 220 of the wavelength conversion layer 200 to the top surface 140 of the substrate 100 as shown in a side cross-sectional view in FIG. 1E. See, for example, paragraph 89.

SUMMARY

It is an object of the invention to provide a thin wavelength converting member and a method for forming the thin wavelength converting member.

Embodiments of the invention include a light emitting device and a wavelength converting ceramic disposed in a path of light emitted by the light emitting device. The wavelength converting ceramic has a thickness between 10 µm and 100 µm.

A method according to embodiments of the invention includes disposing a support layer on a surface of a wavelength converting ceramic wafer. The wavelength converting ceramic wafer and the support layer are diced to form wavelength converting members. A wavelength converting member is attached to a light emitting device. After attaching the wavelength converting member to the light emitting device, the support layer is removed.

BRIEF DESCRIPTION OF THE DRAWINGS

FIGS. 1A, 1B, 1C, 1D, and 1E illustrate process steps needed to fabricate a wavelength conversion chip.

DETAILED DESCRIPTION

Wavelength converting ceramics are attractive for, among other properties, their robustness and ease of handling. One drawback of current wavelength converting ceramics is that the current minimum manufacturable thickness is thicker than desired for some applications. For example, thinner wavelength converting ceramics may improve the flux of the light emitting device.

Wavelength converting ceramics, like the LEDs on which they are disposed, are often square. Square wavelength converting ceramics which are thinner than, for example, 100 µm, have not been a commercially-viable option due to breakage and yield loss during manufacturing. Square wavelength converting ceramics may also have the drawback of a drop in light intensity in areas between the LEDs along the X-axis of an array.

Embodiments of the invention include methods for manufacturing thin wavelength converting members. Though in the description below the wavelength converting members are ceramic, any suitable pre-formed wavelength converting element may be used. Examples of suitable non-ceramic pre-formed wavelength converting elements include powder phosphors that are disposed in transparent material such as silicone or glass that is rolled, cast, or otherwise formed into a sheet, then singulated into individual platelets as described in FIG. 4. The wavelength converting members may be square, rectangular, polygonal, hexagonal, circular, or any other suitable shape. In some embodiments, non-square wavelength converting members may offer performance improvements over square wavelength converting members, by potentially eliminating the drop in light intensity associated with square wavelength converting members, as described above.

The wavelength converting elements include a wavelength converting material which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

Figure 2:
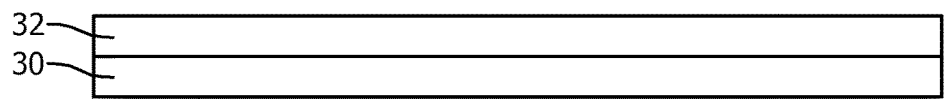
FIG. 2 is a cross sectional view of a portion of a wavelength converting ceramic wafer and a support material.
Figure 3:
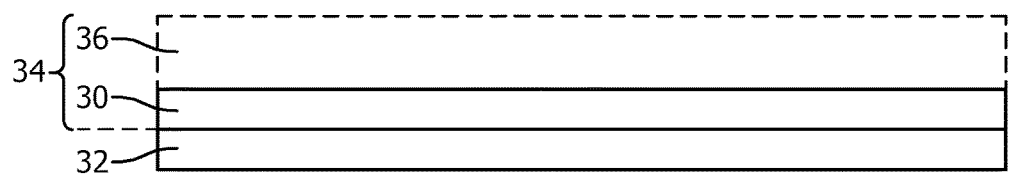
FIG. 3 is a cross sectional view of a portion of a wavelength converting ceramic wafer and a support material, where the wavelength converting ceramic is thinned after forming the support material.
Figure 4:
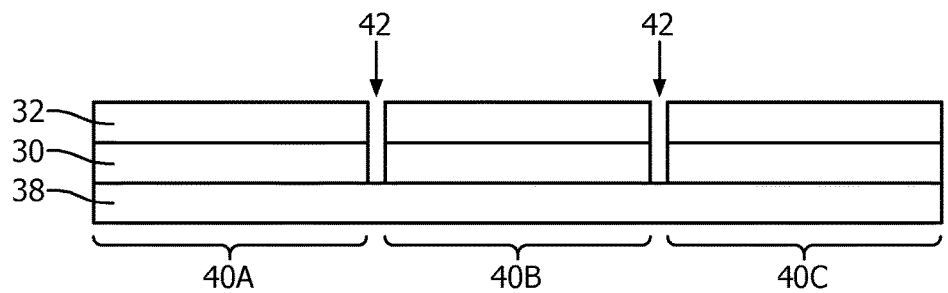
FIG. 4 is a cross sectional view of a portion of a wavelength converting ceramic wafer and a support material after attaching the wafer to dicing tape and singulating the wafer into individual wavelength converting members.

FIGS. 2, 3, and 4 illustrate manufacturing thin ceramic wavelength converting members according to embodiments of the invention. FIGS. 6, 7, 8, and 9 illustrate attaching a thin ceramic wavelength converting member to a device such as an LED.

FIG. 2 illustrates a portion of a wavelength converting ceramic wafer 30 with one surface covered with a support material 32.

The wavelength converting ceramic wafer 30 may be formed by any suitable technique. For example, wavelength converting ceramic wafer 30 may be formed by mixing powder phosphor(s) or powder phosphor precursors, pressing the mixture into a wafer, sintering the wafer, then thinning the wafer, for example by grinding, to the desired thickness.

The wafer may be thinned in multiple thinning steps. The multiple thinning steps may use different grinding conditions. For example, a first grinding step may use a more coarse grinding grit, and a second grinding step may use a more fine grinding grit. In one example, the wafer is first thinned from a thickness of 800 µm to a thickness less than 500 µm (e.g. a thickness of 300 µm) with coarse grinding grit. In a second grinding step, the wafer is thinned from the thickness less than 500 µm to a thickness less than 200 µm (e.g. a thickness of 100 µm or less) with finer grinding grit.

One surface of ceramic wafer 30 is covered with a support material 32. Support material 32 is a material that protects the ceramic wafer 30 during dicing, for example, by reducing breakage which may improve yield. Support material 32 may also be chosen to be easily removed, in embodiments where support material is removed from the ceramic, for example after dicing the ceramic wafer or after attaching a ceramic element to an LED. Any suitable material may be used for support material 32. One example is a polymer material, which may be formed by any suitable technique including, for example, spin casting onto the wafer followed by a low temperature polymer cure specific to the polymer used. Another example is glass formed such that the glass support material can be removed from the ceramic wafer 30.

In some embodiments, the support material 32 is formed on the ceramic wafer 30 before the wafer is thinned, as illustrated in FIG. 3. The support material 32 is formed on a ceramic wafer having a thickness 34 greater than the final thickness. After forming the support material 32, the ceramic wafer 30 is thinned to the final thickness, by removing a portion 36 of the wafer. In embodiments with multiple thinning steps, the support material may be formed before any thinning steps, or between thinning steps. For example, in the embodiment described above with first and second thinning steps, in some embodiments a polymer support material 32 is spin cast on the ceramic wafer after the first, course grind that reduces the thickness from 800 µm to 300 µm, but before the second, fine grind that reduces the thickness from 300 µm down to 100 µm or less. The side of the ceramic wafer 30 on which the support material 32 is formed is not thinned, only the side of the ceramic wafer 30 opposite the support material 32 is thinned, as illustrated in FIG. 3.

In some embodiments, ceramic wafer 30 is formed by tape casting, where a slurry of ceramic and phosphor is cast into a thin sheet of a particular shape and subsequently sintered. After tape casting, a support material 32 such as a polymer may be spin cast onto the wafer followed by a low temperature polymer cure to stabilize the polymer, resulting in the structure illustrated in FIG. 2.

As illustrated in FIG. 4, after the support material 32 is applied to ceramic wafer 30, the structure is put onto a substrate film 38 suitable for dicing. Substrate film 38 may be dicing tape or any other suitable structure. The substrate film 38 is generally attached to the surface of the ceramic wafer 30 opposite the support material 32. For example, in the case of a polymer support material 32 and a dicing tape substrate film 38, since the polymer affinity for the dicing tape is typically high, which would make later removal difficult, the ceramic wafer 30 is oriented to have the ceramic wafer 30 surface touching the tape 38, instead of the polymer support material 32.

Once ceramic wafer 30 is attached to substrate film 38, the ceramic wafer 30 and support material 32 may be separated into individual wavelength converting members by any suitable technique such as, for example, sawing. The structure illustrated in FIG. 4 is separated by cutting in regions 42 to form three individual wavelength converting members 40A, 40B, and 40C. Any suitable dicing or cutting technique may be used. As illustrated in FIG. 4, dicing may cut through ceramic wafer 30 and support material 32, without cutting entirely through substrate film 38. After dicing, the individual wavelength converting members may be squares, rectangles, or any other suitable shape. One advantage of using rectangular wavelength converting members is an improvement in the lumen intensity profile across multiple devices aligned in an array. Rectangular wavelength converting members may also exhibit improved flux, as compared to square wavelength converting members.

The support material 32 supports the fragile, thin ceramic wafer, allowing wafers with a thickness of 130 μm or less to be diced with reduced breakage and improved yield. The ceramic wafer 30 is at least 10 μm thick in some embodiments, no more than 130 μm thick in some embodiments, at least 30 μm thick in some embodiments, no more than 100 μm thick in some embodiments, at least 50 μm thick in some embodiments, and no more than 70 μm thick in some embodiments.

Separate from the wavelength converting members, LEDs or other suitable devices are formed. One example of a suitable III-nitride LED is illustrated in FIG. 5.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 5:
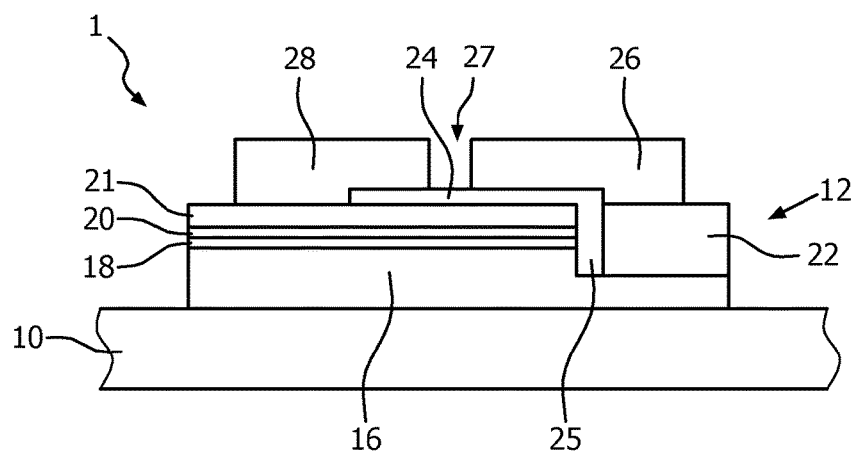
FIG. 5 illustrates one example of a III-nitride LED.

FIG. 5 illustrates a III-nitride LED 1 that may be used in embodiments of the present invention. Any suitable semiconductor light emitting device may be used and embodiments of the invention are not limited to the device illustrated in FIG. 5. The device of FIG. 5 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 5. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Many individual LEDs are formed on a single wafer then diced from a wafer of devices. Any suitable device may be used. The invention is not limited to the particular LED illustrated in FIG. 5. The LEDs are represented in the following figures by block 1.

Figure 6:
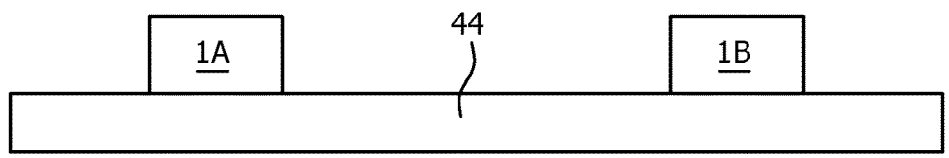
FIG. 6 is a cross sectional view of a portion of a tile of mounts. Two LEDs are mounted on the tile.

FIG. 6 illustrates multiple LEDs mounted on a tile 44 of individual mounts. The LEDs illustrated in FIG. 6 are flipped over relative to the orientation illustrated in FIG. 5, such that the interconnects 26 and 28 are disposed on tile 44, and light is extracted through substrate 10. Tile 44 may be, for example, metal, ceramic, or any other suitable material. LEDs 1 may be attached to tile 44 by, for example, solder, metal interconnects, gold-gold interconnects, stud bumps, or any other suitable technique or structure. Only two LEDs 1A and 1B are illustrated for simplicity; however, it is to be understood that the tile 44 may include many LEDs.

Figure 7:
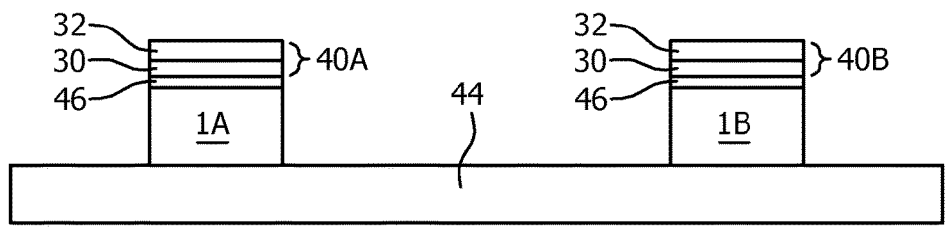
FIG. 7 illustrates the structure of FIG. 6 after attaching individual wavelength converting members to each of the two LEDs.

In FIG. 7, individual wavelength converting elements 40A and 40B are attached to LEDs 1A and 1B. The individual wavelength converting elements may be the wavelength converting elements illustrated in FIG. 4. Wavelength converting elements 40A and 40B may be attached to LEDs 1A and 1B by any suitable technique. In some embodiments, an adhesive 46 such as, for example, silicone is dispensed on the LEDs or on the wavelength converting elements, then a wavelength converting element is removed from substrate film 38 of FIG. 4 and placed on the LED of FIG. 7. The LEDs 1A and 1B may be the same shape as the wavelength converting elements 40A and 40B (i.e., rectangular wavelength converting elements may be attached to rectangular LEDs), or a different shape (i.e., rectangular wavelength converting elements may be attached to square LEDs or LEDs of other shapes).

Figure 8:
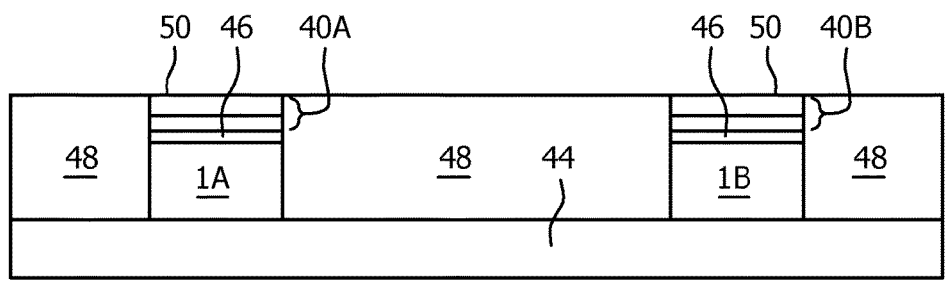
FIG. 8 illustrates the structure of FIG. 7 after forming a reflective layer between the LEDs.

In FIG. 8, reflective material 48 is formed in the regions between the LEDs. For example, a mold may be disposed over tile 44. The mold may include indentations that correspond to the shape of the LEDs 1A, 1B, though it need not. A molding compound, which is a viscous mixture of a matrix material (often silicone, epoxy, or glass, but any suitable material may be used) and reflective particles (often $TiO_2$ but any suitable material may be used), is disposed over the mold to fill the mold. The tile 44 and LEDs 1A, 1B and the mold are brought together under pressure so that the LEDs 1A, 1B are immersed in the molding compound. A vacuum may be created between the mold and the tile. The molding compound is cured, such as by heating. The tile and mold are then separated. The hardened molding compound may be further cured, for example by heating or exposing to ultraviolet radiation. After curing, the molding compound is generally reflective, white, and opaque.

In some embodiments, rather than molding compound, a sol gel material is used. In such embodiments, a mixture of reflective particles and sol gel liquid may be dispensed over the LEDs 1A, 1B, then water is evaporated from the sol gel liquid, leaving a silicate network that is essentially a glass with reflective particles embedded in the silicate network.

In some embodiments, a material with a high thermal conductivity; for example, with a higher thermal conductivity than the transparent material and/or the reflective particles, may be added to the mixture. For example, the material with high thermal conductivity may have a thermal conductivity higher than that of common silicone materials, which may have a thermal conductivity around 0.1-0.2 W/mK.

In some embodiments, reflective material is disposed over the tops of LEDs 1A, 1B during molding. The excess reflective material may be removed by wet beat blasting or any other suitable technique. After removing excessive reflective material, the tops 50 of wavelength converting elements 40A and 40B are exposed.

Figure 9:
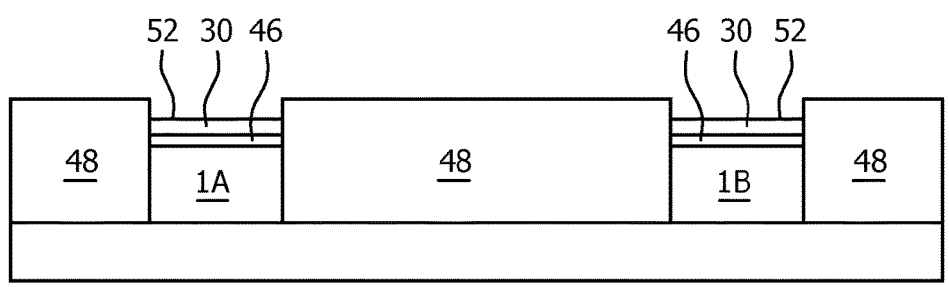
FIG. 9 illustrates the structure of FIG. 8 after removing the support material from the individual wavelength converting members.

In FIG. 9, the support material 32 is removed from each wavelength converting member 40A, 40B. The support material may be removed by any suitable technique. In embodiments where the support material is one or more carbon-containing polymers, the support material may be removed by ozone plasma treatments. The activated oxygen reacts with the polymer to create $CO_2$, thus destroying and removing the polymer. The process is referred to as "ashing" and is well known in the semiconductor industry for removing polymeric photo resist. Ashing recipes typically have both inert gasses (Ar, $N_2$, etc.) and oxygen plasma.

Removing the support material 32 exposes a top surface 52 of each wavelength converting ceramic 30. In some embodiments, if the support material is sufficiently thick to cause a lip or rim of reflective material around the perimeter of the wavelength converting elements 40A, 40B, the excess material may be removed, for example by bead blasting. After removing the excess material, as illustrated in FIG. 10, the top surface 56 of reflective material 48 is at substantially the same height as the top surface 52 of each wavelength converting ceramic 30.

Figure 10:
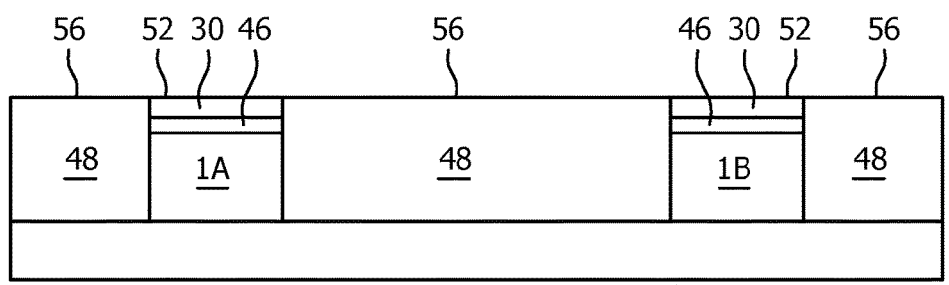
FIG. 10 illustrates the structure of FIG. 9 after thinning reflective layer.

The structure illustrated in FIG. 10 may be separated into individual devices or arrays or other groups of devices by cutting through the tile 44 and reflective material 48 in the region 54 between neighboring LEDs.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A method comprising:
  disposing a support layer on a surface of a wavelength converting ceramic wafer;
  dicing the wavelength converting ceramic wafer and the support layer to form wavelength converting members;
  attaching a wavelength converting member to a light emitting device; and
  after attaching the wavelength converting member to the light emitting device, removing the support layer.

2. The method of claim 1 further comprising thinning the wavelength converting ceramic wafer after disposing the support layer on the surface of the wavelength converting ceramic wafer.

3. The method of claim 1 wherein the wavelength converting ceramic wafer has a thickness less than 100 µm.

4. The method of claim 1 wherein disposing the support layer on the surface of the wavelength converting ceramic wafer comprises spin casting a polymer layer on the surface of the wavelength converting ceramic wafer.

5. The method of claim 1 further comprising disposing a reflective material around the light emitting device prior to removing the support layer.

6. The method of claim 5 further comprising removing a portion of the reflective material after removing the support layer.

7. The method of claim 1 wherein the support material comprises a polymer and removing the support layer comprises removing with ozone plasma treatment.

8. The method of claim 1 wherein the wavelength converting member is rectangular.

9. A method comprising:
  thinning a wavelength converting ceramic wafer to a thickness less than 500 µm in a first thinning process;
  disposing a support layer on a surface of a wavelength converting ceramic wafer;
  after disposing the support layer on a surface of the wavelength converting ceramic wafer, thinning the wavelength converting ceramic wafer to a thickness less than 200µm in a second thinning process;
  dicing the wavelength converting ceramic wafer and the support layer to form wavelength converting members;
  attaching a wavelength converting member to a light emitting device; and
  after attaching the wavelength converting member to the light emitting device, removing the support layer.

10. The method of claim 9 further comprising:
  disposing a reflective material around the light emitting device prior to removing the support layer; and removing a portion of the reflective material after removing the support layer.

* * * * *